United States Patent
Ghanbari Milani et al.

(10) Patent No.: US 11,853,747 B2
(45) Date of Patent: Dec. 26, 2023

(54) METHOD FOR TESTING AN APPLICATION FOR VEHICLES

(71) Applicant: Robert Bosch GmbH, Stuttgart (DE)

(72) Inventors: Farzaneh Ghanbari Milani, Korntal-Muenchingen (DE); Tunan Shen, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 113 days.

(21) Appl. No.: 17/455,657

(22) Filed: Nov. 18, 2021

(65) Prior Publication Data
US 2022/0171616 A1    Jun. 2, 2022

(30) Foreign Application Priority Data
Nov. 27, 2020   (DE) ...................... 10 2020 214 922.4

(51) Int. Cl.
G06F 8/71         (2018.01)
G06F 30/20        (2020.01)
G06F 8/65         (2018.01)

(52) U.S. Cl.
CPC .................. G06F 8/71 (2013.01); G06F 8/65 (2013.01); G06F 30/20 (2020.01)

(58) Field of Classification Search
CPC ............... G06F 8/71; G06F 30/20; G06F 8/65
(Continued)

(56) References Cited

U.S. PATENT DOCUMENTS

2014/0330401 A1*   11/2014   Franzen ................ G05B 17/02
                                                    700/29
2018/0267538 A1*   9/2018    Shum ..................... G06F 30/20
(Continued)

FOREIGN PATENT DOCUMENTS

DE         10303489 A1       8/2004
DE         102009018761 A1   10/2010
(Continued)

OTHER PUBLICATIONS

Tuncali et al, "Simulation-based Adversarial Test Generation for Autonomous Vehicles with Machine Learning Components", 2018, [Online], pp. 1555-1562, [Retrieved from internet on Aug. 7, 2023], <https://ieeexplore.ieee.org/stamp/stamp.jsp?arnumber=8500421> (Year: 2018).*

*Primary Examiner* — S. Sough
*Assistant Examiner* — Zengpu Wei
(74) *Attorney, Agent, or Firm* — NORTON ROSE FULBRIGHT US LLP; Gerard Messina

(57) ABSTRACT

A method for testing an updated version of an application for vehicles. In the method, input data for the application, which are used for a present version of the application on at least one vehicle, and output data of the present version of the application are received by a vehicle-external computing system, from the at least one vehicle via a wireless data link. The updated version of the application is executed on the vehicle-external computing system using the received input data. Output data of the updated version of the application are compared with the received output data of the present version of the application. An evaluation of the updated version of the application being carried out, based on the comparison.

8 Claims, 2 Drawing Sheets

(58) Field of Classification Search
USPC .......................................................... 717/168
See application file for complete search history.

(56) References Cited

U.S. PATENT DOCUMENTS

2020/0125354 A1* 4/2020 Kim .................... G06F 11/0754
2022/0035965 A1* 2/2022 Liebman ............... G06F 18/214

FOREIGN PATENT DOCUMENTS

| DE | 102015203766 A1 | 9/2016 |
| DE | 102017208986 A1 | 11/2018 |
| DE | 202018106888 U1 | 1/2019 |
| DE | 102018207565 A1 | 11/2019 |
| DE | 102018219015 A1 | 5/2020 |

* cited by examiner

METHOD FOR TESTING AN APPLICATION FOR VEHICLES

FIELD

The present invention relates to a method for testing an updated version of an application for vehicles as well as a computing system and a computer program for the execution thereof.

BACKGROUND INFORMATION

Applications (software) are generally executed on computing units, such as control units in vehicles (i.e., in the automotive sector), which typically should or, in some cases, also must be continuously updated (e.g., within the scope of an update). The increasing use of networked communication even in the automotive sector results in the fact that software updates of this type may not or not only take place in workshops by special programming devices, as has been usual up to now, but are also possible wirelessly or online, for example, via the mobile radio network (also referred to as "flash over the air," FOTA, or "software over the air," SOTA).

SUMMARY

According to the present invention, a method is provided for testing an updated version of an application for vehicles as well as a computing system and a computer program for carrying it out. Advantageous embodiments of the present invention are disclosed herein.

The present invention deals with the testing of an updated version of an application—i.e., for example a control software or a control function—for vehicles, which is to be used, for example, as an update for a present or previous version of the application executed on the vehicle or on a control unit therein. In this context, the term "application" may relate to a complete, independently executable software or only parts thereof, for example individual function modules or the like.

As mentioned, updates of this type may be downloaded or transferred to a vehicle from a vehicle-external computing unit (informally referred to as a "cloud"). However, it is desirable—and sometimes even necessary, in particular in safety-critical applications (or control units)—that such updated versions of applications are also sufficiently tested prior to their use in the field for the purpose of avoiding unforeseen malfunctions.

During the development stage of vehicles, applications may be thoroughly tested on test benches or in test vehicles, i.e., it is checked whether the application behaves as desired in the field, for example whether certain input data result in certain output data. In later updates of such applications, which are necessary or desired, for example within the scope of error corrections or the introduction of new or modified functions, such test vehicles or also test benches are often not available or not in sufficient quantity, or conventional test series take too long. A great amount of time and high development costs may also be necessary. A usual release process is therefore not possible or possibly not in time (e.g., in the case of safety-critical updates). However, in the case of such safety-critical updates, in particular, unknown errors, which may, for example, negatively influence the driving behavior, may have a fatal effect.

In accordance with an example embodiment of the present invention, it is provided that input data for the application, which are used on at least one vehicle for a present version of the application (which is executed on the vehicle) and output data of the present version of the application are received by a vehicle-external computing system, such as a server or a cloud server, from the at least one vehicle via a wireless data link, such as a mobile radio link, possibly also WLAN. In other words, one or preferably multiple vehicles, on which a present version of the application is executed, transfer their input data for this application, which they also use themselves, to the computing system, and likewise transfer the output data, which they receive during the execution of the application on the vehicle, or which are supplied by the application used, to the computing system. All this may, but does not have to, take place in real time.

For test purposes, the new or updated version of the application is then initially transferred to a cloud or to the vehicle-external computing system. This cloud or the vehicle-external computing system is connected to (selected) vehicles via a wireless connection. The updated version of the application is then executed on the vehicle-external computing system using the received input data, possibly also in parallel or in real time. This is understood to mean, in particular, that a vehicle computing unit (so-called control unit), which receives the updated version of the application, is simulated. However, it is also conceivable that one or multiple real vehicle computing units are used in the computing system.

Output data of the updated version of the application, which are maintained accordingly directly on the computing system, are then compared with the received output data of the present version of the application—which thus originate directly from vehicles. Based on the comparison, an evaluation of the updated version of the application is then carried out. The updated version is thus, for example, released, and, in particular, also provided for downloading to vehicles if the output data of the updated version meet predefined release criteria. This may include, for example, that the output data of the updated version may deviate from the output of the present version only to a certain degree. If the release criteria are not met, the updated version may or should be adapted again. The test may then be repeated accordingly.

The present invention therefore creates a possibility for testing new applications more or less in the field on a multiplicity of vehicles without the latter being exposed to any sort of risk. This is due, in particular, to the fact that the present version of the application or the application itself remains unchanged on the vehicle.

The input data and output data are preferably received from different types of vehicles. Different types of vehicles are understood to be, in particular, vehicles having a different topology and/or other differences, such as engines or power ratings. It is thus often provided that a particular application is used for different types of vehicles, for example including different engines or engine power ratings. Depending on the type of vehicle, the application should, however, possibly also respond differently. If the updated version of the application is then executed on the computing system using the received input data, different predefined functions of the application should then also be executed, which are provided for these different types of vehicles. One example of this would be that a brake regulating system (which is controlled by the application) should intervene differently, e.g., earlier or more intensively, in a more highly motorized vehicle or in a vehicle towing a trailer than in a less motorized vehicle or one not towing a trailer.

In this regard, it is also advantageous that, if the updated version of the application is executed using the received input data on the computing system, predefined test sequences and/or operating states of a vehicle are simulated. These relevant test sequences or operating states may be predefined, for example, by a developer.

The described procedure of the present invention thus permits a realistic analysis of applications or functions which may or should be transferred wirelessly (SOTA). At the end of a test of this type or also a test phase of this type, the tested application may be transferred to a computing unit in the vehicle.

Due to the described test method of the present invention, applications may be tested in a realistic scenario using real vehicles. The applications are tested, in particular, with regard to their interfaces or their interaction with other applications or the remaining computing unit, for which purpose the application (or possibly also other applications or parts thereof) are to be simulated or represented accordingly on the computing system. Potential errors in the test phase may be identified thereby, and undesirable consequences of a possible error after the update may be avoided.

During the testing, it may also be checked whether all information necessary for the application is provided via the new interface. No additional test carriers are needed. In addition, the scope of the necessary test drives may be reduced. Different test series may, for example, also be carried out in an automated and reproducible manner.

A computing system according to the present invention, e.g., a computer or server, is configured to carry out a method according to the present invention, in particular from a programming point of view.

It is also advantageous to implement a method according to the present invention in the form of a computer program or computer program product, including program code, to carry out all method steps, since this is particularly cost-effective, in particular when an executing computing system is used for other tasks and is thus present anyway. Suitable data media for providing the computer program are, in particular, magnetic, optical and electrical memories, such as hard disks, flash memories, EEPROMs, DVDs, among other things. Downloading a program via computer networks (Internet, intranet, etc.) is also possible.

Further advantages and embodiments of the present invention result from the description herein and the figures.

The present invention is schematically illustrated in the figures on the basis of an exemplary embodiment and is described below with reference to the figures.

DETAILED DESCRIPTION OF EXAMPLE EMBODIMENTS

Figure 1:
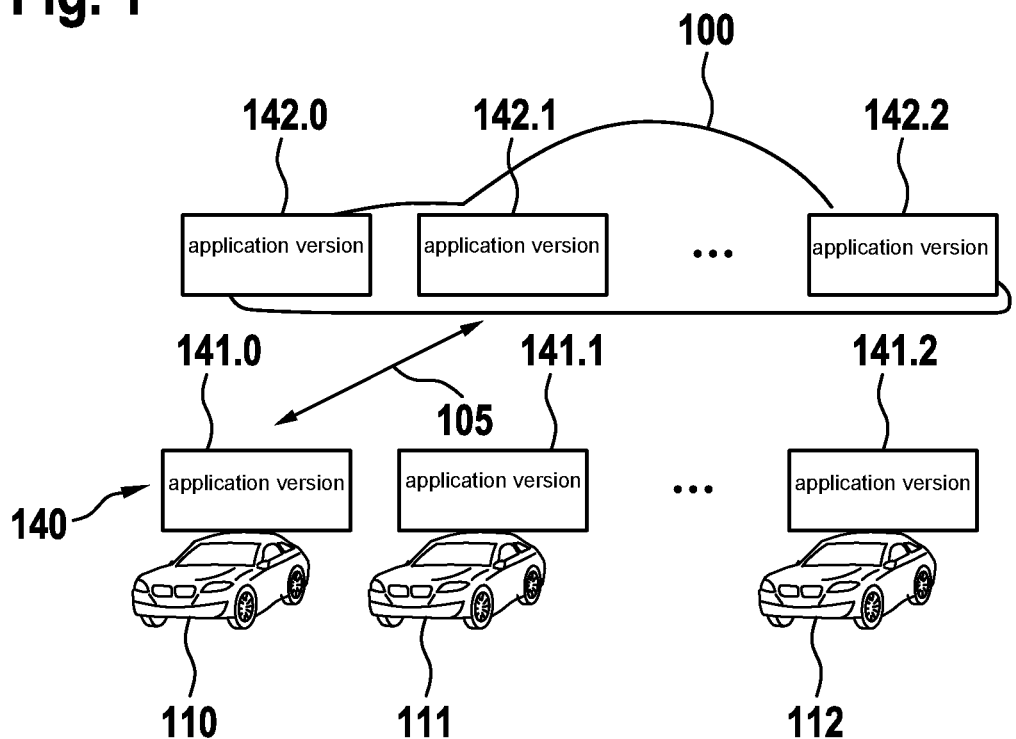
FIG. 1 schematically shows a situation for explaining a method according to the present invention in one preferred specific embodiment of the present invention.

A situation for explaining a method according to the present invention is illustrated schematically in one preferred specific embodiment in FIG. 1. For this purpose, a vehicle-external computing system 100 is illustrated (for example, as a "cloud"). In addition, three vehicles 110, 111 and 112 are shown as examples, which may be different types of vehicles, e.g., vehicles having different levels of motorization. An application runs on the vehicles in each case, or, for example, on a computing unit or a control unit therein, in a present or "old" version 141.0, 141.1 or 141.2.

Computing system 100 is connected to each of vehicles 110, 111, 112 via a wireless data link 105, e.g., a mobile radio link, such as UMTS or LTE, in a data-transferring manner.

Figure 2:
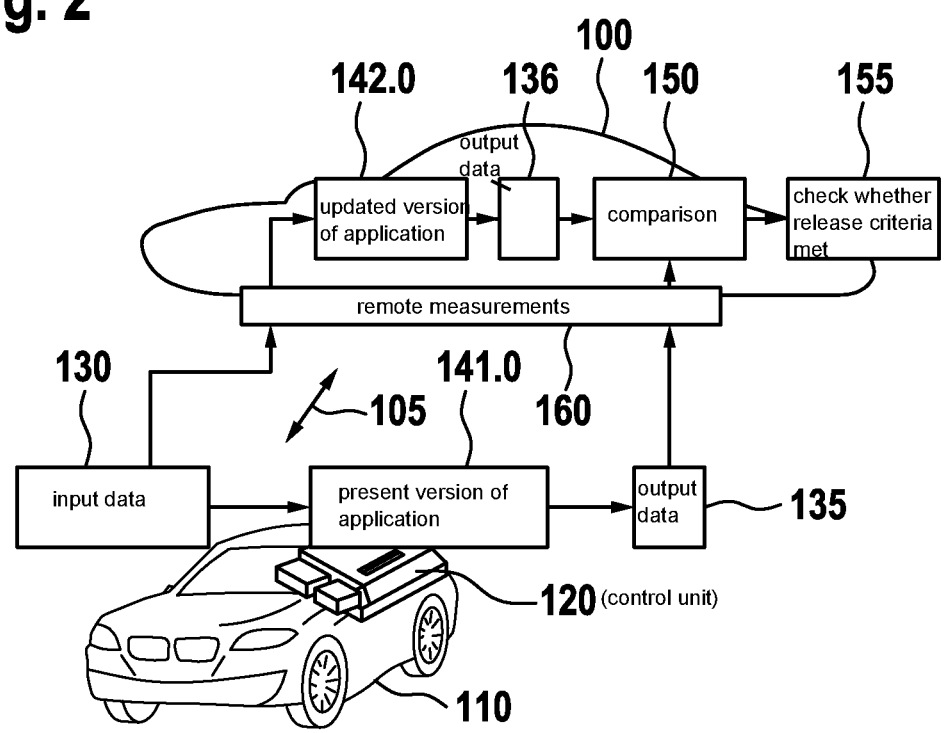
FIG. 2 schematically shows a sequence of a method according to the present invention in one preferred specific embodiment of the present invention.

FIG. 2 schematically shows a sequence of a method according to the present invention in one preferred specific embodiment, but only as an example for vehicle 110. The application is also executed—or simulated—on computing system 100, but in an updated or "new" version 142.0, which is to be tested.

For this purpose, it may first be established which test sequences, operating states or operating points and the like should or must be covered during testing. These may vary from application to application and are typically defined by a function developer. In addition, necessary data and signals, which are, in principle, possible as inputs and/or outputs, should be defined.

It may furthermore be checked whether the interface(s) of new updated version 142.0 match(es) the interface(s) of present version 141.0, which runs in vehicle 110 or on control unit 120 therein. For example, the sampling rate, format, etc. should be checked.

Vehicles or test vehicles are then also selected which—as shown in FIG. 1—are connected to computing system 100 and which may be used for testing the application on the computing system. During the test phase, the functional capability of the test vehicles is not impaired, since the latter use the application present in the vehicle or its functions (i.e., in the present version) for normal operation.

The relevant application in the vehicle, to which the input and output data are to be transferred, may be selected, for example, by a corresponding command, which is sent from computing system 100 to the vehicle. Operating states relevant to the test scenarios are defined for this purpose, e.g., as triggers for remote measurements 160. The relevant signals to be detected (i.e., input data 130 and output data 135) may be defined, for example, in a configuration file, which is sent to the vehicle. Accordingly, these signals are measured in defined operating states and sent to the cloud or computing system 100. These are, in particular, normal or regular vehicles in the field, which have (e.g., generally existing) remote measurement capability, but are not special test vehicles.

Different vehicle types or topologies are needed for some applications, as already mentioned with reference to FIG. 1. In selecting test vehicles, it must be taken into account which vehicle topologies are necessary for testing the application. The vehicles and/or the types or variants of vehicles which are to be used may be selected, for example, by a developer. For example, the shares of the different types in all vehicles may also be determined by the developer, likewise a total number of vehicles. The specific, individual vehicles (in the field), may, in turn, be selected, for example by a computer according to the random principle.

For this purpose, a copy of the application to be tested may be created in the updated version on computing system 100 for each vehicle type or each topology and parameterized accordingly. This is illustrated in FIG. 1 by 142.0, 142.1 and 142.2. The same applies to the variants of the present version of the application, 141.0, 141.1 and 141.2.

The application to be tested then runs in updated version 142.0 on computing system 100, as illustrated in FIG. 2; input data 130 of the vehicle, which are used as the function input, are sent to computing system 100 via wireless data link 105 (possible in the stationary state, possibly also via WLAN). As a result, the application may be operated on the computing system with the aid of real inputs and outputs from vehicle 110.

This makes it possible to test the application in different situations and operating states or operating points. Output data 136 of the application to be tested (in the updated version) are compared with output data 135 existing in the vehicle, present version 141.0. Based on a comparison 150 of this type, an evaluation may then be carried out, for example by checking whether specific release criteria 155 have been met. This may take place together for the results of all types of vehicles.

If updated version 142.0 of the application does not meet release criteria 155, the application must be, for example, adapted and retested. If it does meet release criteria 155, it may be provided, for example, for downloading.

On the whole, a release may takes place with the aid of the described procedure even for safety critical applications for vehicles, which are updated (only) wirelessly. In principle, all types of applications which are SOTA-capable may be considered here, typical examples being applications or functions in the areas of propulsion, braking, steering or also diagnosis. For example, the area of autonomous or automated driving is particularly relevant.

Figure 3:
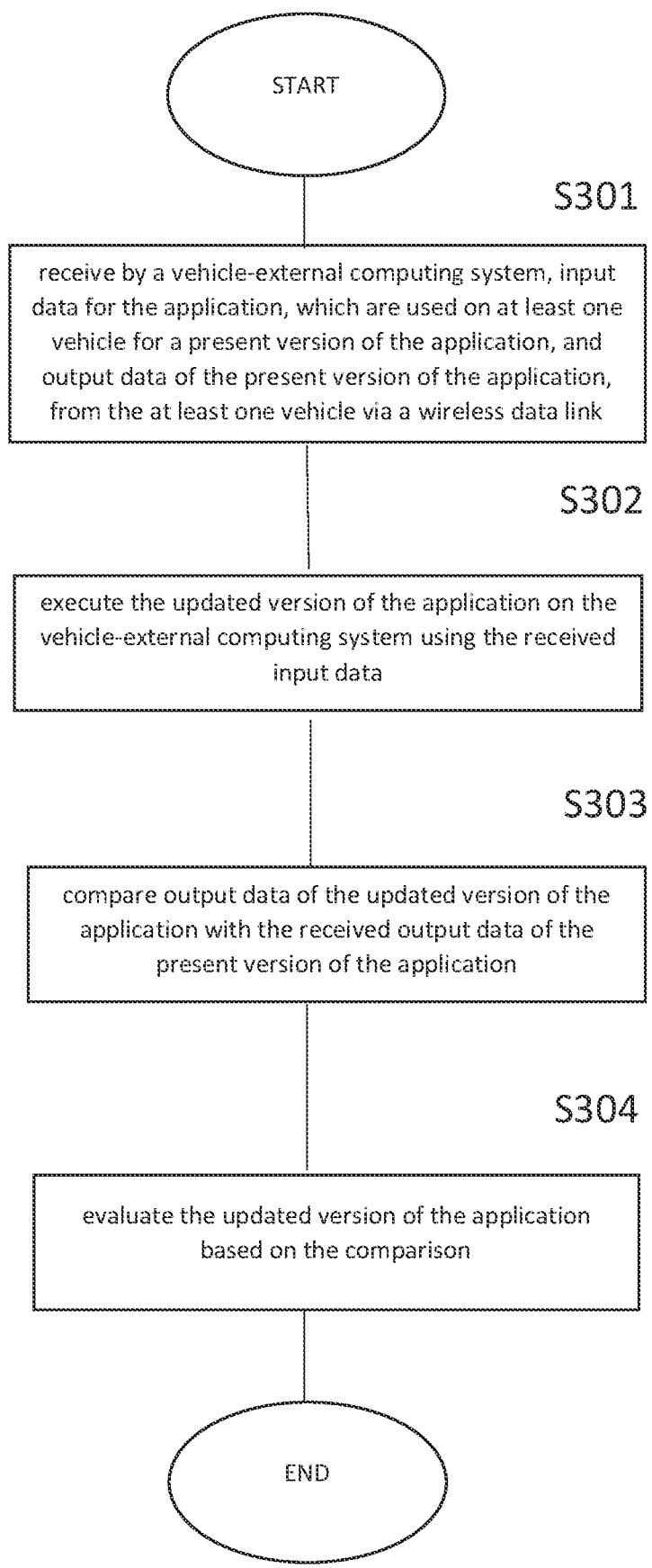
FIG. 3 shows a flow diagram according to an exemplary embodiment of the disclosed invention.

FIG. 3 shows a flow diagram according to an exemplary embodiment of the disclosed invention. In particular, S301 is directed to receiving by a vehicle-external computing system 100, input data 130 for the application, which are used on at least one vehicle 110 for a present version 141 of the application, and output data 135 of the present version 141 of the application, from the at least one vehicle 110 via a wireless data link 105. S302 is directed to executing the updated version 142 of the application on the vehicle-external computing system 100 using the received input data 130. S303 is directed to comparing output data 136 of the updated version 142 of the application with the received output data 135 of the present version 141 of the application. S304 is directed to evaluating the updated version 142 of the application based on the comparison.

What is claimed is:

1. A method for testing an updated version of an application for a vehicle, the method comprising the following steps:

receiving by a vehicle-external computing system, input data for the application, which are used on at least one vehicle for a present version of the application, and output data of the present version of the application, from the at least one vehicle via a wireless data link;

executing the updated version of the application on the vehicle-external computing system using the received input data;

comparing output data of the updated version of the application with the received output data of the present version of the application; and evaluating the updated version of the application based on the comparison.

2. The method as recited in claim 1, wherein receiving step includes receiving input data and output data from different types of vehicles, and, when the updated version of the application is executed on the vehicle-external computing system using the received input data from the different types of vehicle, different predefined functions of the application are carried out, which are provided for the different types of vehicles.

3. The method as recited in claim 1, wherein, when the updated version of the application is executed on the vehicle-external computing system using the received input data, predefined test sequences and/or operating states of a vehicle are simulated.

4. The method as recited in claim 1, wherein a mobile radio link is used as the wireless data link.

5. The method as recited in claim 1, wherein the updated version of the application is released and provided for downloading to vehicles when the output data of the updated version of the application meet predefined release criteria.

6. The method as recited in claim 1, wherein a test mode is activated on a computer unit of the at least one vehicle, which executes the present version of the application, in which the input data and the output data are detected and transferred to the vehicle-external computing system.

7. A computing system configured to test an updated version of an application for a vehicle, the computing system configured to:

receive input data for the application, which are used on at least one vehicle for a present version of the application, and output data of the present version of the application, from the at least one vehicle via a wireless data link, wherein the computing system is a vehicle-external computing system;

executing the updated version of the application on the vehicle-external computing system using the received input data;

comparing output data of the updated version of the application with the received output data of the present version of the application; and evaluating the updated version of the application based on the comparison.

8. A non-transitory machine-readable storage medium on which is stored a computer program for testing an updated version of an application for a vehicle, the computer program, when executed by a vehicle-external computing system, causing the vehicle-external computing system to perform the following steps:

receiving by the vehicle-external computing system, input data for the application, which are used on at least one vehicle for a present version of the application, and output data of the present version of the application, from the at least one vehicle via a wireless data link;

executing the updated version of the application on the vehicle-external computing system using the received input data;

comparing output data of the updated version of the application with the received output data of the present version of the application; and evaluating the updated version of the application based on the comparison.

\* \* \* \* \*